United States Patent [19]
Koike

[11] Patent Number: 5,544,012
[45] Date of Patent: Aug. 6, 1996

[54] COOLING SYSTEM FOR COOLING ELECTRONIC APPARATUS

[75] Inventor: Norihiro Koike, Tokyo, Japan

[73] Assignee: Kabushiki Kaisha Toshiba, Kawasaki, Japan

[21] Appl. No.: 364,987

[22] Filed: Dec. 28, 1994

[30] Foreign Application Priority Data

Dec. 28, 1993 [JP] Japan .................................. 5-351056

[51] Int. Cl.⁶ .................................................. H05K 7/20
[52] U.S. Cl. ........................ 361/695; 165/122; 312/236; 454/184
[58] Field of Search .......................... 312/236; 454/184; 174/16.1; 165/122, 124, 126, 80.3; 361/695, 697, 687, 694, 690

[56] References Cited

U.S. PATENT DOCUMENTS

| | | | |
|---|---|---|---|
| 4,682,268 | 7/1987 | Okano | 361/384 |
| 4,797,783 | 1/1989 | Kohmoto | 361/384 |
| 4,901,138 | 2/1990 | Kushibiki | 357/81 |
| 4,907,645 | 3/1990 | Dumas | 361/695 |
| 5,136,464 | 8/1992 | Ohmori . | |
| 5,150,277 | 9/1992 | Bainbridge | 361/384 |
| 5,321,581 | 6/1994 | Bartilson | 361/695 |
| 5,361,188 | 11/1994 | Kondow | 361/695 |

FOREIGN PATENT DOCUMENTS 0966942A  10/1982  U.S.S.R. ................. 361/695

OTHER PUBLICATIONS

"Uninterruptible —System", Chu, IBM Tech Discl Bull vol. 15 No. 12 May 1973, p. 3654.

*Primary Examiner*—Gerald P. Tolin
*Attorney, Agent, or Firm*—Oblon, Spivak, McClelland, Maier, & Neustadt, P.C.

[57] ABSTRACT

A cover is provided on at least one of the faces of a box body. A plurality of elements to be cooled are arranged in tiers within the box body so as to be opposed to one face of the box body. A horizontal duct is provided at a lower part within the box body. A vertical duct is provided between the elements and the cover. Guide members are situated within the vertical duct and the box body. The guide members guide the air stream, sucked into the elements, and the air stream exhausted from the elements along predetermined passages.

25 Claims, 12 Drawing Sheets

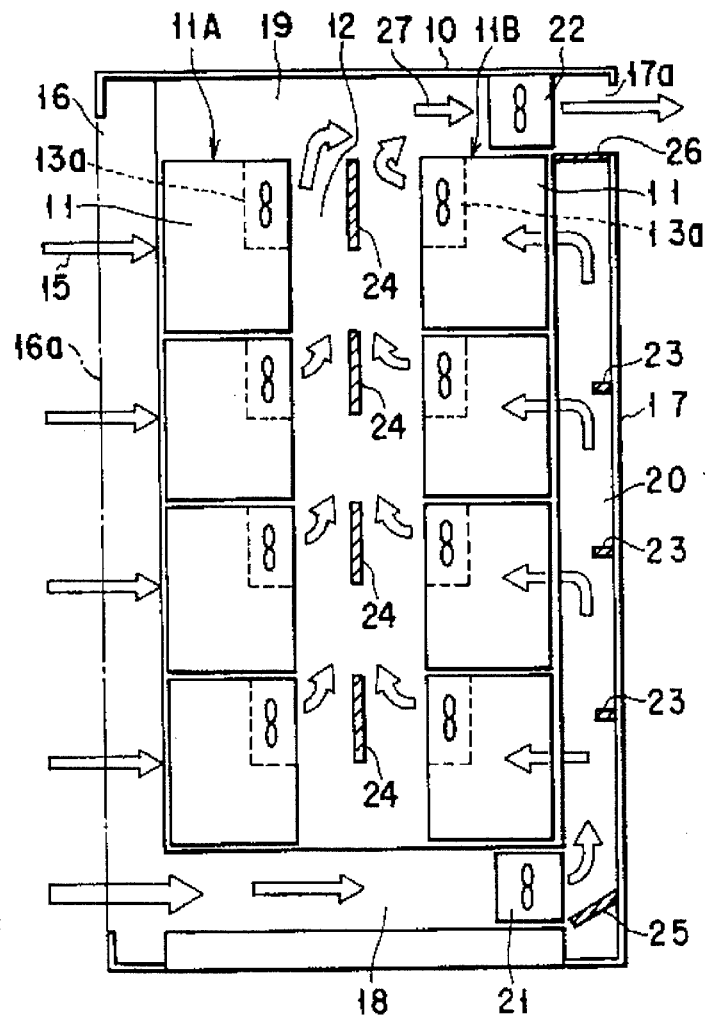
F I G. 3
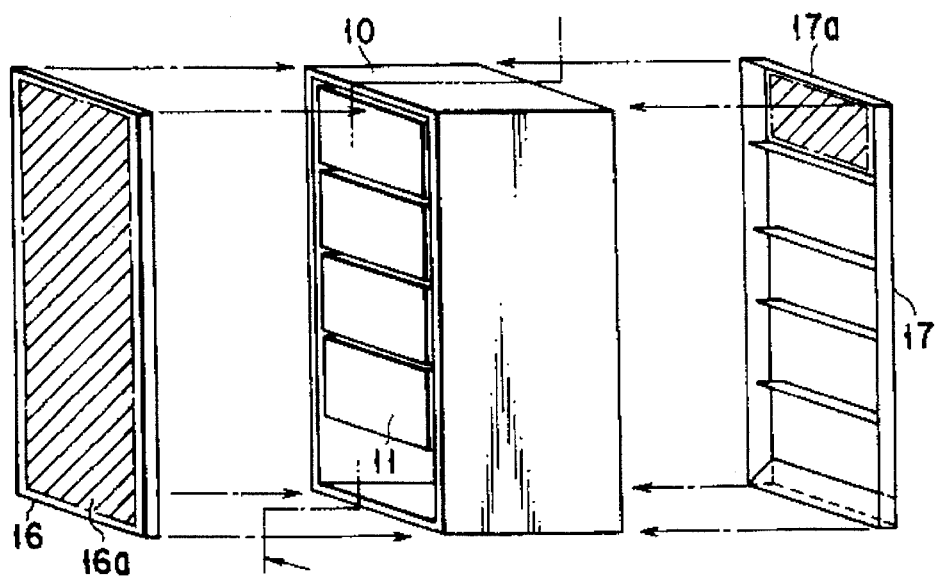
F I G. 6

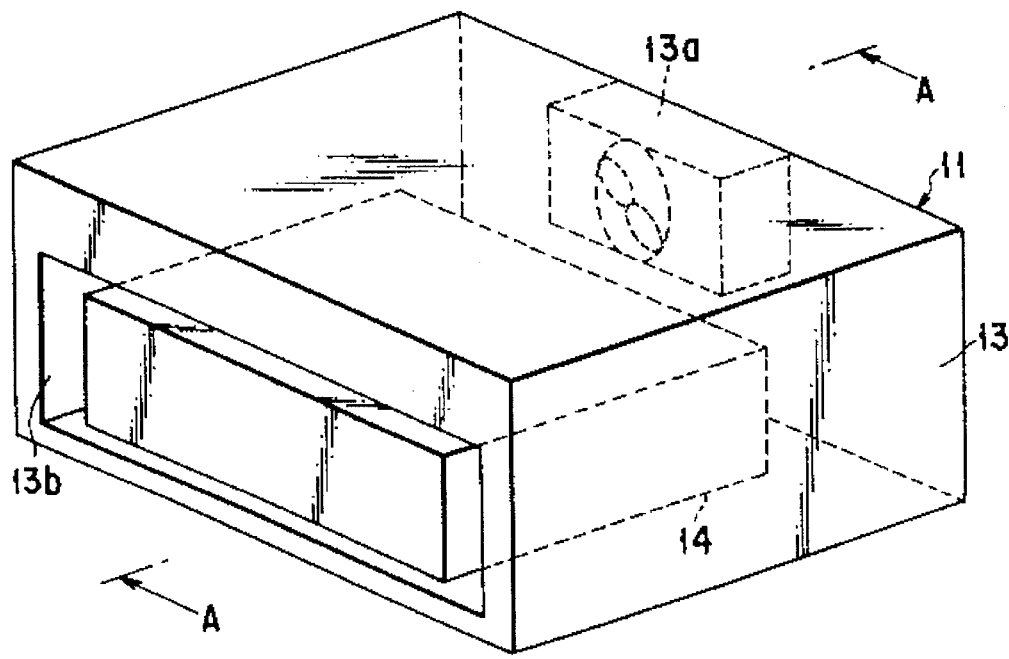
F I G. 4
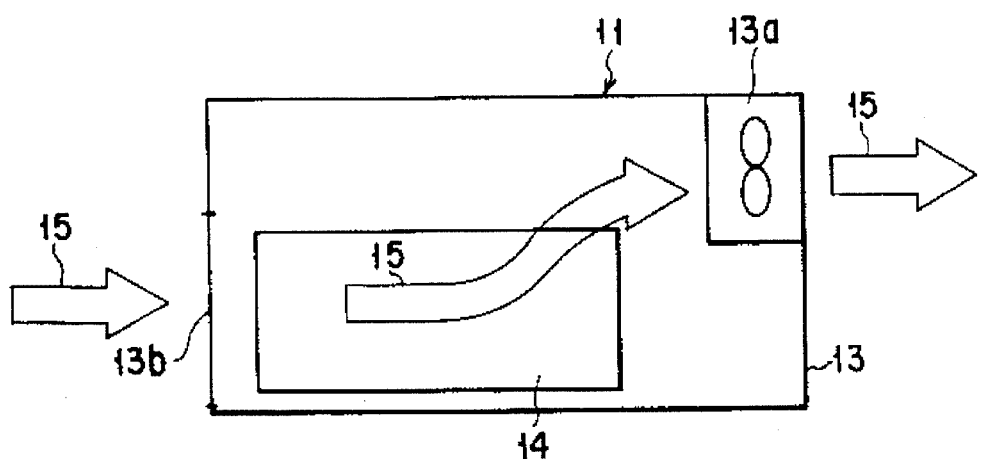
F I G. 5

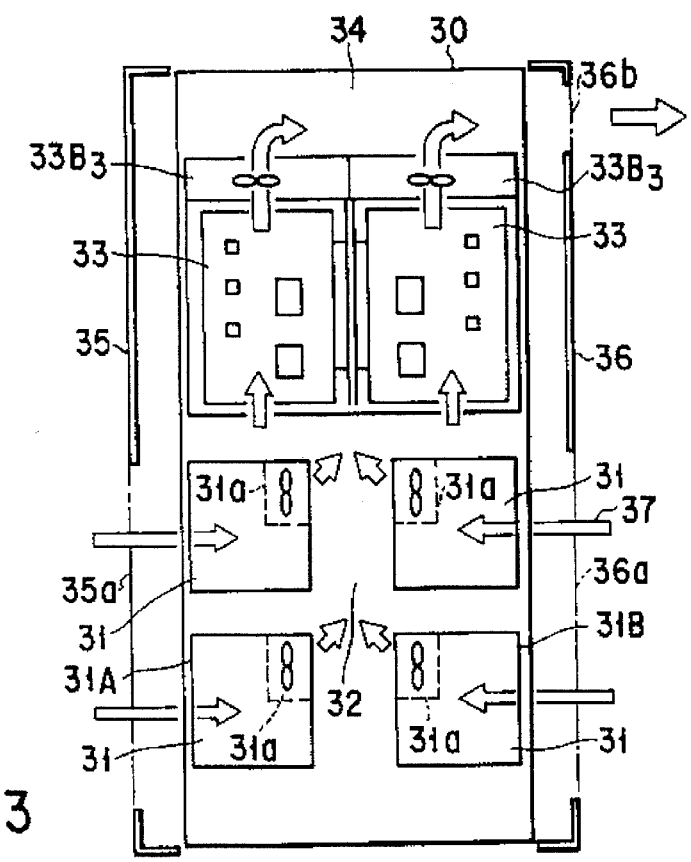
F I G. 13
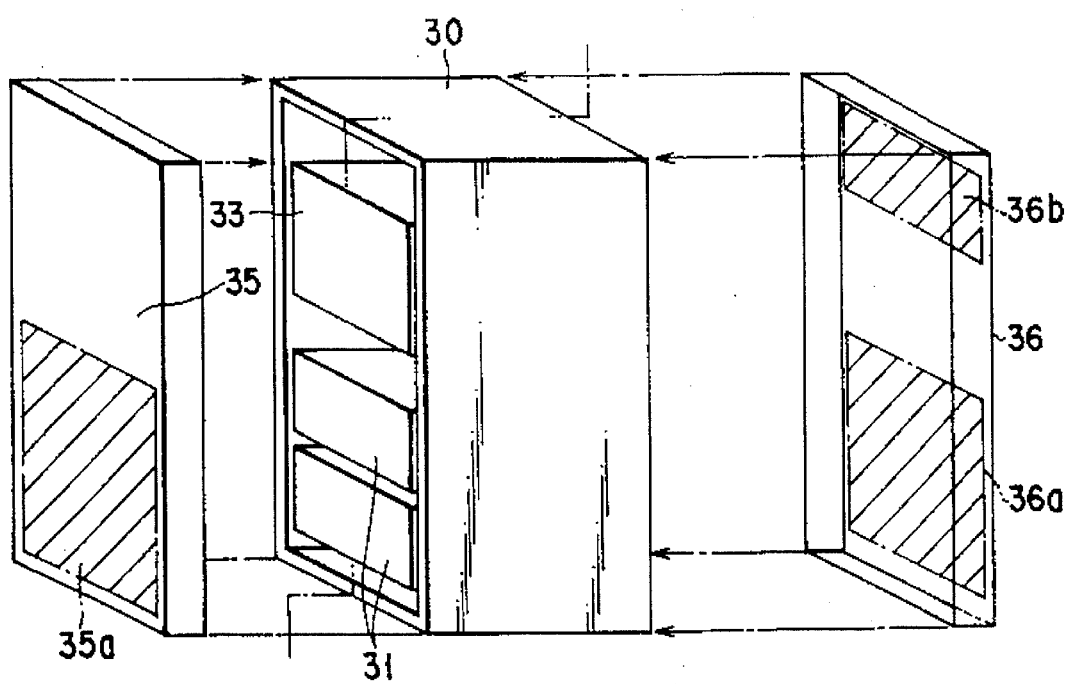
F I G. 14

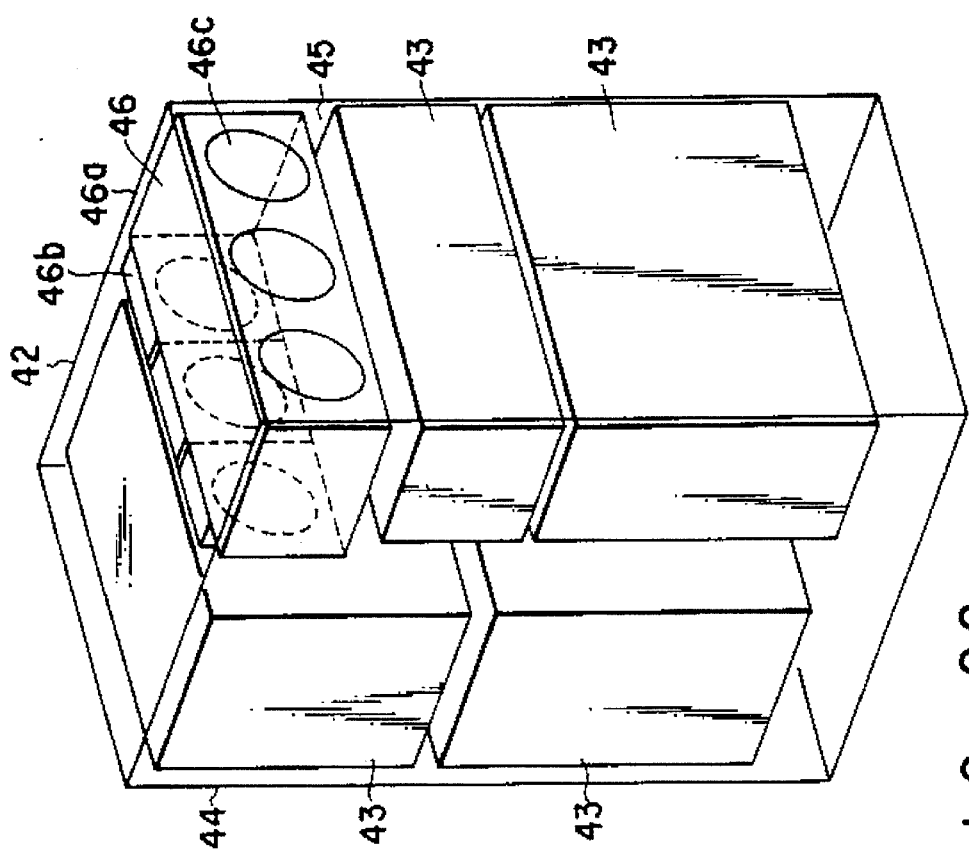
F I G. 22
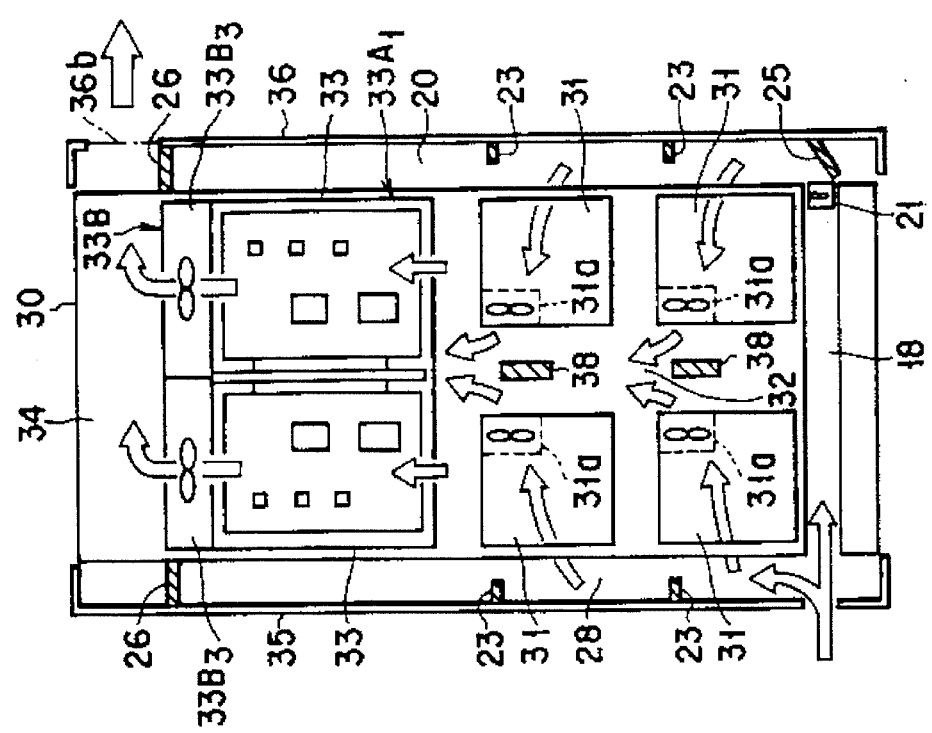
F I G. 21

COOLING SYSTEM FOR COOLING ELECTRONIC APPARATUS

BACKGROUND OF THE INVENTION

1. Field of the Invention

The present invention relates to a cooling method, a cooling system and a fan apparatus for cooling an electronic apparatus with air streams.

2. Description of the Related Art

Electronic elements such as a device module and a circuit board module are contained in an electronic apparatus such as a CPU cabinet of a computer system. Natural or forced air streams are let to enter the electronic apparatus, thereby cooling the electronic elements. FIG. 1 shows an example of a cooling structure in this type of conventional electronic apparatus.

As is shown in FIG. 1, the front face of a box body 10 is closed by a front cover 16. An air suction port 16a is formed in substantially the entire surface of the front cover 16. The rear face of the box body 10 is closed by a rear cover 17. An exhaust port 17a is formed in an upper part of the rear cover 17. A fan 22 is provided in an upper region on the rear side of the box body 10, at a position facing the exhaust port 17a. A plurality of electric elements 1 are situated within the box body 10 on the front side.

In this type of conventional electronic apparatus, air streams 2 introduced from the air suction port 16a pass through the electronic elements 1 to be cooled. Each air stream 2 divides into an air stream 2a going upward in the box body 10 and an air stream 2b going straight toward the rear in the box body 10. The air streams 2 introduced from the air suction port 16a in the front cover 16 are passed through the electronic elements 1 and exhausted via the exhaust port 17a to the outside as an exhaust air stream 3 by the fan 22 provided in the upper region on the rear side. Thereby, the electronic elements 1 are forcibly cooled by the air streams.

The above cooling system, however, has the following problem. The air stream 2a flows smoothly along the substantially straight line connecting the air suction port 16a and fan 22, and cools efficiently the front and middle parts of the electronic element 1 located in the course of the air stream 2a. However, the air stream 2b flows off the substantially straight line connecting the air suction port 16a and fan 22, and stagnates in a rear-side space 4 in the box body 10. Consequently, the rear part of the electronic element 1 located along the air stream 2b is not cooled efficiently.

SUMMARY OF THE INVENTION

The object of the invention is to provide a cooling method for an electronic apparatus, a cooling system for an electronic apparatus and a fan apparatus for efficiently cooling electronic elements.

This object is achieved by a cooling method for an electronic apparatus, for cooling an electronic element contained in the electronic apparatus by an air stream, the method comprising the steps of:

introducing an air stream from one side of the electronic apparatus and guiding the air stream towards the other side of the electronic apparatus;

guiding the air stream in a height direction of the electronic apparatus; and feeding the air stream into the electronic element from the other side of electronic apparatus.

The above object is achieved by a cooling method for an electronic apparatus, for cooling an electronic element contained in the electronic apparatus by an air stream, the method comprising the steps of:

introducing an air stream from one side of the electronic apparatus and guiding the air stream towards the other side of the electronic apparatus;

guiding the air stream in a height direction on the one side of the electronic apparatus and in a height direction on the other side of the electronic apparatus; and feeding the air stream into the electronic element from both the one side and the other side of the electronic apparatus.

The above object is achieved by a cooling system for an electronic apparatus, for cooling an electronic element contained in the electronic apparatus by an air stream, the system comprising:

a horizontal duct for introducing an air stream from one side of the electronic apparatus and guiding the air stream towards the other side of the electronic apparatus; and a vertical duct for guiding the air stream, introduced by the horizontal duct, in a height direction of the electronic apparatus and feeding the air stream into the electronic element from the other side of electronic apparatus.

The above object is also achieved by a cooling system for an electronic apparatus, for cooling an electronic element contained in the electronic apparatus by an air stream, the system comprising:

a horizontal duct for introducing an air stream from one side of the electronic apparatus and guiding the air stream towards the other side of the electronic apparatus;

a one-side vertical duct, provided on the one side of the electronic apparatus, for guiding the air stream, introduced by the horizontal duct, in a height direction of the electronic apparatus; and an other-side vertical duct, provided on the other side of the electronic apparatus, for guiding the air stream, introduced by the horizontal duct, in a height direction of the electronic apparatus and feeding the air stream into the electronic element from the one side and other side of electronic apparatus.

The above object is also achieved by a cooling system for an electronic apparatus, for cooling an electronic element contained in the electronic apparatus by an air stream, the system comprising:

a sealing mechanism provided within the electronic apparatus to seal a lower part of the electronic apparatus, in which the electronic element is situated, from an upper part of the electronic apparatus, the sealing mechanism including a fan unit for sucking air from the lower part and exhausting the air to the upper part.

The above object is also achieved by a fan apparatus comprising:

a first fan; and a second fan situated apart from the first fan at a predetermined distance, wherein the distance between the first and second fans is equal to or greater than the diameter of each of the first and second fans.

In the method and system for cooling the electronic apparatus according to the present invention, an air stream introduced from one side of the apparatus is fed towards the other side thereof and then guided upwards, so that the air stream is fed into the electronic elements from the other side of the apparatus. Thus, those parts of the electronic devices, which face the other side of the apparatus, can be effectively cooled.

In the method and system for cooling the electronic apparatus according to the present invention, an air stream introduced from one side of the apparatus is fed towards the other side thereof and then guided upwards in both-side regions within the apparatus, so that the air stream is fed into the electronic elements from both sides of the apparatus. Thus, those parts of the electronic devices, which face both sides of the apparatus, can be effectively cooled.

In the cooling system for cooling the electronic apparatus according to the present invention, a lower part of the apparatus, which contains electronic elements, is sealed from an upper part of the apparatus by means of a sealing mechanism including a fan apparatus for sucking air from the lower part and exhausting the air to the upper part. The negative pressure created by the fan apparatus acts on the lower part effectively. Thereby, the air stream is let to flow smoothly from the lower part to the upper part, and the electronic elements situated in the lower part can be cooled effectively.

In the fan apparatus of the present invention, the distance provided between the first and second fans is greater than the diameter of each fan. Thus, the cooling performance can be increased by the two fans. Moreover, interference of noise of the fans does not occur easily and howling of fans can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a cross-sectional side view showing schematically an electronic apparatus according to a second embodiment of an electronic apparatus cooling apparatus of the present invention;

FIG. 4 is a perspective view showing schematically a device module in the second embodiment;

FIG. 5 is a cross-sectional side view showing schematically the device module in the second embodiment;

FIG. 6 is an exploded perspective view of the apparatus of the second embodiment, as viewed in the lateral direction;

FIG. 13 is a cross-sectional side view showing schematically an electronic apparatus according to a ninth embodiment of an electronic apparatus cooling apparatus of the present invention;

FIG. 14 is an exploded perspective view of the apparatus of the ninth embodiment, as viewed in the lateral direction;

FIG. 21 is a cross-sectional side view showing schematically an electronic apparatus according to a 14th embodiment of an electronic apparatus cooling apparatus of the present invention;

FIG. 22 is a cross-sectional side view showing schematically an example of an electronic apparatus in which a fan apparatus according to the present invention is built;

DETAILED DESCRIPTION OF THE PREFERRED EMBODIMENTS

Preferred embodiments of the electronic apparatus according to the present invention will now be described with reference to the accompanying drawings.

Figure 2:
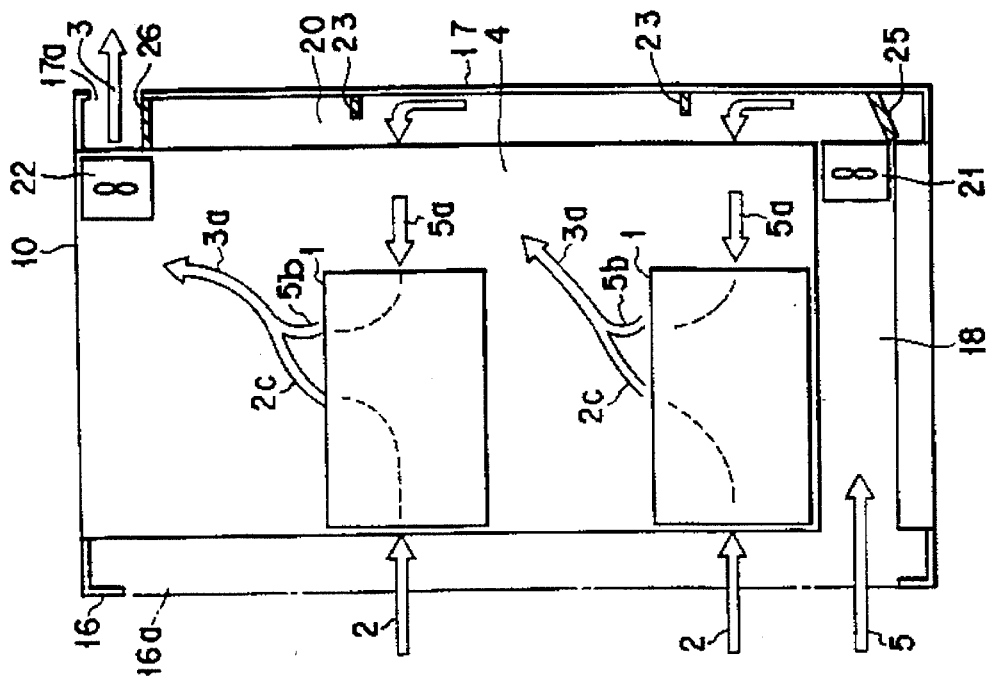
FIG. 2 is cross-sectional side view showing schematically an electronic apparatus according to a first embodiment of an electronic apparatus cooling apparatus of the present invention.
Figure 1:
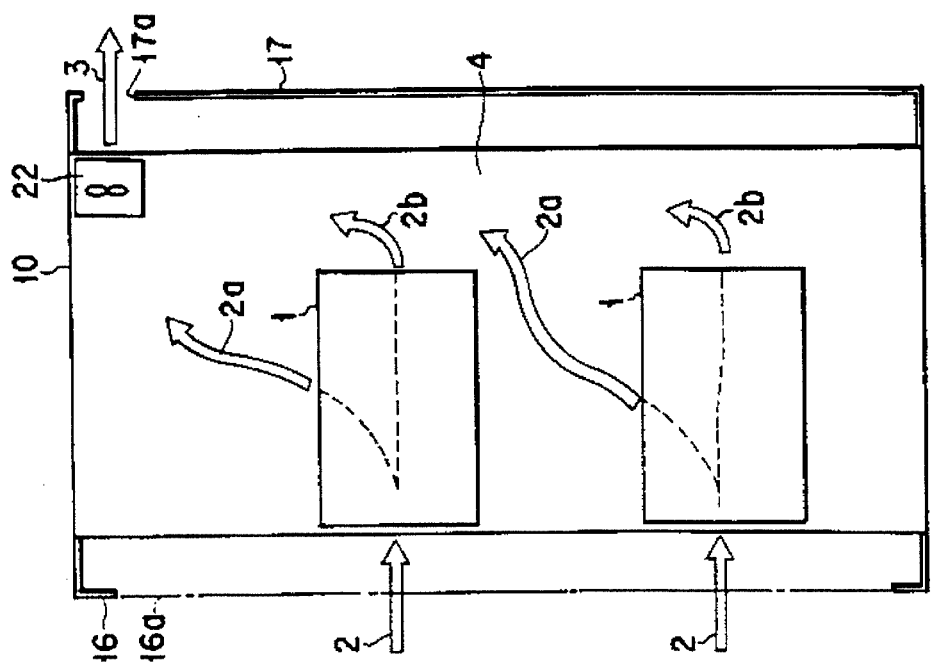
FIG. 1 is a cross-sectional side view showing schematically an electronic apparatus according to an example of a conventional electronic apparatus cooling apparatus.

An electronic apparatus according to a first embodiment of an electronic apparatus cooling apparatus of the present invention will now be described with reference to FIG. 2. In FIG. 2, the front face of a box body 10 of the electronic apparatus is closed by a front cover 16. An air suction port 16a is formed in substantially the entire surface of the front cover 16.

The rear face of the box body 10 is closed by a rear cover 17. An exhaust port 17a is formed in an upper part of the rear cover 17. A fan 22 is provided in an upper region on the rear side of the box body 10, at a position facing the exhaust port 17a. A plurality of electric elements 1 are situated within the box body 10 on the front side.

A lower horizontal duct 18 is provided at a lower part of the box body 10 in order to introduce an air stream from the outside. A rear-side vertical duct 20 is provided between the box body 10 and rear cover 17 in order to guide the air stream introduced into the lower horizontal duct 18 towards the rear parts of the electronic elements 1. The lower horizontal duct 18 is provided with a lower fan 21 for guiding the air stream, introduced into the lower horizontal duct 18, into the rear-side vertical duct 20.

The electronic apparatus according to this embodiment has a guide unit constituted by orientation plates 23, a guide plate 25 and a seal plate 26. The guide unit guides the air stream to the electronic elements 1 along predetermined passages.

The orientation plates 23 are arranged within the rear-side vertical duct 20 and situated to extend in a direction perpendicular to the longitudinal direction of the rear-side vertical duct 20. The number of orientation plates 23 is two in FIG. 2.

The guide plate 25 is situated at an angle at a connection area between the lower horizontal duct 18 and the rear-side vertical duct 20.

The seal plate 26 is situated so as to seal the rear-side vertical duct 20 from the exhaust port 17a.

In the electronic apparatus of the first embodiment, air streams 2 introduced from the air suction port 16a enter the front parts of the electronic elements 1 to be cooled and go out of the elements 1 upward within the box body 10. An air stream 5 introduced from the suction port 16a flows through the horizontal duct 18 and rear-side vertical duct 20 and are divided into air streams 5a by the orientation plates 23. The air streams 5a flow in a rear region 4, enter the rear parts of the electronic elements 1 to be cooled, go out of the elements 1 as air streams 5b flowing upwards within the box body 10.

Accordingly, the air stream 2c flows smoothly along the substantially straight line connecting the air suction port 16a and fan 22, and cools efficiently the front and middle parts of the electronic element 1 located in the course of the air stream 2c. In addition, the air streams 5a and 5b flow smoothly along the curved line connecting the vertical duct 20, the regions of the orientation plates 23, and the fan 22. Thus, the rear and middle parts of the electronic elements 1 are efficiently cooled by the air streams 5a and 5b.

As has been described above, according to the first embodiment, there is provided an electronic apparatus cooling apparatus capable of efficiently cooling the electronic elements 1.

An electronic apparatus according to a second embodiment of the electronic apparatus cooling apparatus of the invention, in which a device module is contained as an object to be cooled, will now be described with reference to FIGS. 3 to 6. Specifically, a plurality of device modules 11 are arranged in stages within the box body 10 which is, in general, a six-face frame body, such that the modules 11 face the front part of the box body 10 (these modules 11 are referred to as "front-side device module 11A"). In addition, a plurality of modules 11 are arranged in stages within the box body 10 so as to face the rear part of the box body 10 (these modules 11 are referred to as "rear-side device module 11B"). A space within the box body 10 between the front-side device module 11A and rear-side device module 11B functions as a confluent duct 12 in which air streams from the front-side and rear-side device modules 11A and 11B are combined.

Each device module 11 is constructed, as shown in FIGS. 4 and 5. Specifically, the device module 11 is constructed such that a device 14 such as a power supply circuit unit, an input/output circuit unit or a memory unit is contained within a chassis 13 to which a fan 13a is attached. In this device module 11, an air stream 15 introduced from a suction port 13b formed in a lower front portion of the chassis 13 is guided through the device 14 and discharged from an upper rear portion of the chassis 13 by means of the fan 13a. Thus, the device 14 can be cooled by the air stream 15.

In addition to the above-described device module 11, a circuit board module (to be described later) as shown in FIGS. 13 and 14 is another example of an object to be stored in the electronic apparatus and cooled. This circuit board module is a combination of many wiring boards including a mother board.

As is shown in FIGS. 3 and 6, the front face of the box body 10 is closed by a front cover 16. An air suction port 16a is formed in substantially the entire surface of the front cover 16. The rear face of the box body 10 is closed by a rear cover 17. An exhaust port 17a is formed in an upper part of the rear cover 17.

A lower horizontal duct 18 is provided at a lower part of the box body 10 in order to introduce an air stream from the outside. An upper horizontal duct 19 is provided at an upper part of the box body 10 in order to exhaust the air stream to the outside of the box body 10. A rear-side vertical duct 20 is provided between the rear-side device modules 11B and rear cover 17 in order to guide the air stream introduced into the lower horizontal duct 18 towards the rear modules 11 of the rear-side device module 11B. The lower horizontal duct 18 is provided with a lower fan 21 for guiding the air stream, introduced into the lower horizontal duct 18, into the rear-side vertical duct 20. The upper horizontal duct 19 is provided with an upper fan 22 for exhausting the air stream collected in the upper horizontal duct 19 to the outside of the box body 10.

The electronic apparatus according to this embodiment has a guide unit constituted by orientation plates 23, partition plates 24, a guide plate 25 and a seal plate 26. The guide unit guides the air streams entering and coming out of the device modules 11 of the front-side and rear-side device modules 11A and 11B along predetermined passages.

The orientation plates 23 are arranged within the rear-side vertical duct 20 located behind the rear-side device module 11B and situated to extend in a direction perpendicular to the longitudinal direction of the rear-side vertical duct 20. The number of orientation plates 23 is three in FIG. 3.

The partition plates 24 are provided within a confluent duct 12 and situated to extend in the longitudinal direction (direction of exhaustion) of the confluent duct 12. The number of partition plates 24 is four in FIG. 3. Specifically, the partition plates 24 are situated within the confluent duct 12 in the respective stages of the device modules 11 of the front-side and rear-side device modules 11A and 11B.

The guide plate 25 is situated at an angle at a connection area between the lower horizontal duct 18 and the rear-side vertical duct 20.

The seal plate 26 is situated so as to seal the rear-side vertical duct 20 from the exhaust port 17a.

The operation of the electronic apparatus with the above structure according to the second embodiment will now be described. Air streams introduced from the suction port 16a in the front cover 16 pass through the modules 11 of the front-side device module 11A and also pass through the modules 11 of the rear-side device module 11B via the horizontal duct 18, rear-side vertical duct 20 and orientation plates 23. The air streams 15 coming out of the front-side and rear-side device modules 11 are made confluent in the vicinity of the rear cover 17, without interfering with each other in the center region of the box body 10 by virtue of the partition plates 24 situated in the respective stages of the modules 11. The confluent stream 27 is exhausted to the outside of the box body 10 from the upper part of the exhaust port 17a by a negative pressure created by the upper fan 22. Thus, the front-side and rear-side device modules 11 are cooled by the air streams 15.

As has been described above, in the electronic apparatus of this embodiment, since the front-side and rear-side device modules are arranged in stages (vertically), a high cooling performance is attained and the modules can be contained at high density.

With this structure, effective cooling is achieved and the modules are contained at high density. In addition, the space for installation of the apparatus can be effectively used and the degree of freedom of design is increased. Specifically, when the electronic apparatus is installed in a room, it should suffice to keep such a space between the rear face of the apparatus and the wall of the room as to match with the flow amount and flow speed of the air stream 27 exhausted from the exhaust port 17a.

However, in the case of an electronic apparatus having air suction ports for device modules in substantially both the entire front and rear faces, a greater distance than in the present embodiment needs to be provided between the rear face of the apparatus and the wall of the room. By contrast, in the case of the electronic apparatus of the present embodiment, the space for installation in the room is effectively used.

In addition, in the case of the electronic apparatus having air suction ports for device modules in substantially both the entire front and rear faces, the rear space of the apparatus is used both as a suction space and an exhaust space. Thus, part of the air stream exhausted from the box body 10 may be sucked in the box body 10 and the cooling air stream may be heated. Consequently, effective cooling may not be performed. By contrast, in the case of the electronic apparatus of the present embodiment, this problem does not occur and effective cooling can be achieved.

Furthermore, in the case of the electronic apparatus having air suction ports for device modules in substantially both the entire front and rear faces, the suction port is formed in substantially the entire area of each of the front and rear faces. Thus, the degree of freedom of design is limited. As regards the electronic apparatus of the present embodiment, this problem does not arise and a desired design can be adopted.

Figure 7:
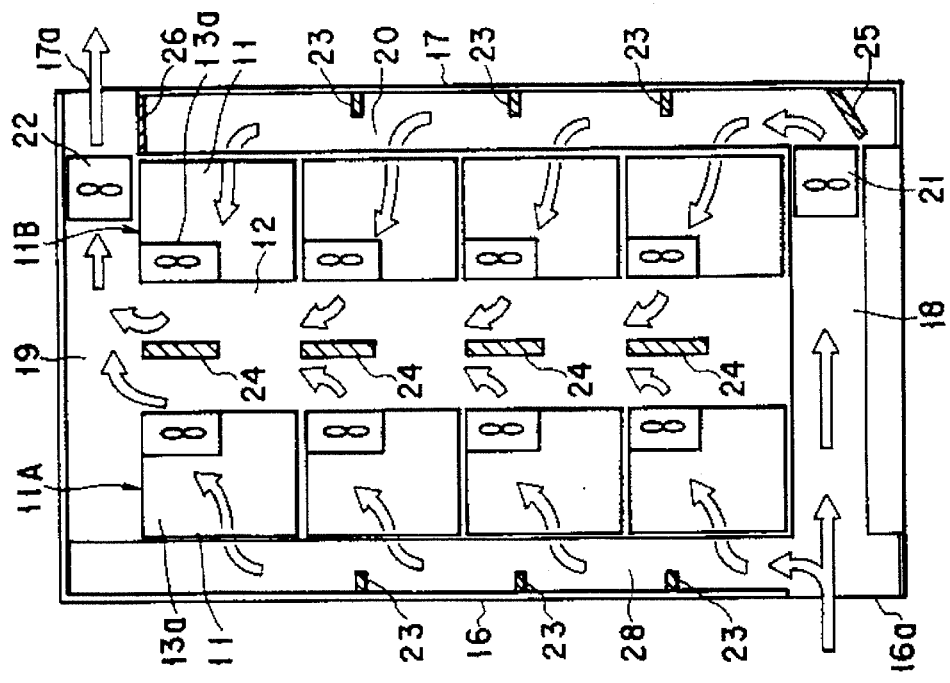
FIG. 7 is a cross-sectional side view showing schematically an electronic apparatus according to a third embodiment of an electronic apparatus cooling apparatus of the present invention.

An electronic apparatus according to a third embodiment of the invention will now be described with reference to FIG. 7. As is shown in FIG. 7, the electronic apparatus according to the third embodiment is provided with a front-side vertical duct 28 between the front-side device module 11A and front cover 16. An air stream introduced into the lower horizontal duct 18 is guided by the front-side vertical duct 28 into 10 the device modules 11 of the front-side device module 11A. Orientation plates 23 are arranged in the front-side vertical duct 28 defined between the front-side device module 11A and the device modules 11 such that the orientation plates 23 extend in a direction perpendicular to the longitudinal direction of the front-side vertical duct 28. The number of the orientation plates 23 arranged in the vertical duct 28 is three in FIG. 7.

According to the third embodiment, not only the rear side but also the front side of the apparatus can be cooled effectively, and the modules can be contained at high density. Moreover, the installation space can be effectively used and the degree of freedom of design can be enhanced.

Figure 8:
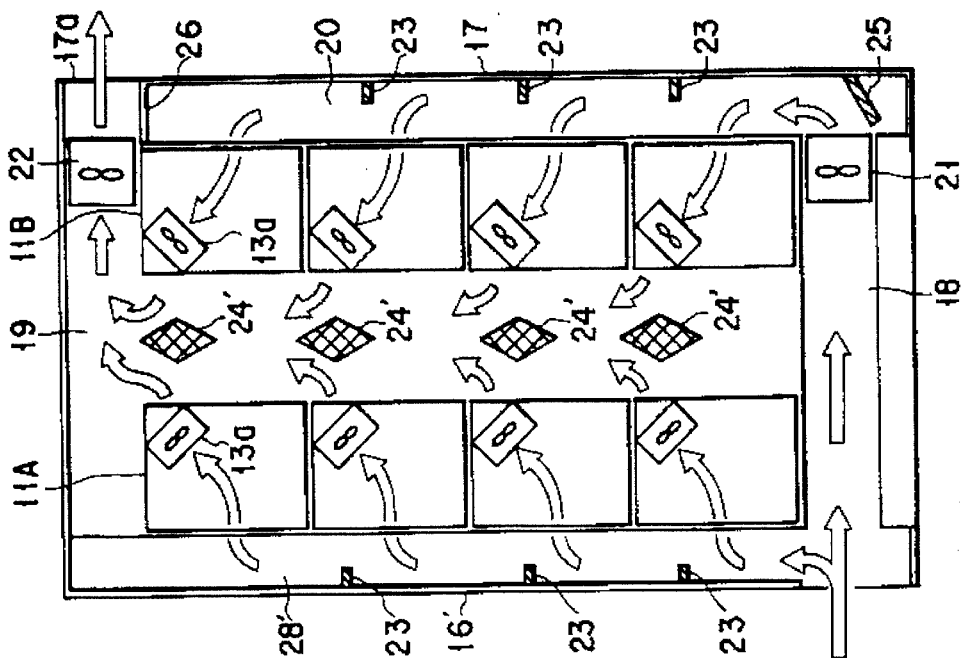
FIG. 8 is a cross-sectional side view showing schematically an electronic apparatus according to a fourth embodiment of an electronic apparatus cooling apparatus of the present invention.

An electronic apparatus according to a fourth embodiment of the invention will now be described with reference to FIG. 8. As is shown in FIG. 8, in the electronic apparatus according to the fourth embodiment, the fans 13A and partition plates 24 of the device modules 11 of the electronic apparatus according to the second or third embodiment are modified to let the air streams 15 to flow in desirable courses. The desirable courses of the air streams 15 may vary, depending on the tiered arrangement of the device modules 11. In FIG. 8, the desirable courses are those in which the air steams 15 coming out of the modules 11 go upwards in the confluent duct 12. Accordingly, the fans 13a are inclined to suck and discharge the air streams upwards in the confluent duct 12, and each of partition plates 24' of the fourth embodiment has a rhombic cross section.

According to the fourth embodiment with the above structure, the air streams can be properly distributed within the box body 10. In particular, interference of the air streams exhausted from the device modules 11 can be prevented effectively. Of course, like the electronic apparatuses of the first and second embodiments, effective cooling is achieved and the modules are contained at high density. In addition, the space for installation of the apparatus can be effectively used and the degree of freedom of design is increased.

Figure 9:
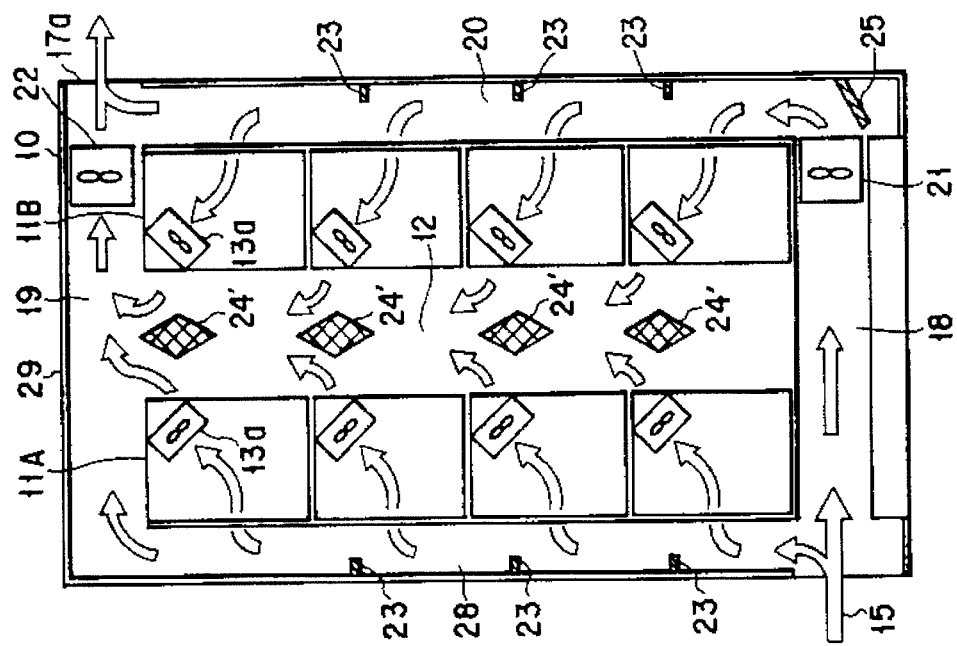
FIG. 9 is a cross-sectional side view showing schematically an electronic apparatus according to a fifth embodiment of an electronic apparatus cooling apparatus of the present invention.

An electronic apparatus according to a fifth embodiment of the invention will now be described with reference to FIG. 9. As is shown in FIG. 9, in the electronic apparatus according to the fifth embodiment, the sealing structure of the upper part of the box body 10 of the electronic apparatuses according to the second, third and fourth embodiments is modified, and the structure of the connecting portion between the exhaust port 17a and rear-side vertical duct 20 is modified. Specifically, a mesh cover 29 is provided at the upper face of the box body 10, and the sealing plate 26 is removed to permit the exhaust port 17a to communicate with the rear-side vertical duct 20.

According to the fifth embodiment with the above structure, part of the air steams to be exhausted by the upper fan 22 can be discharged to the outside of the box body 10 through the mesh cover 29 provided at the top face of the box body 10. Since the exhaust port 17a is made to communicate with the rear-side vertical duct 20, the exhaustion performance which the upper fan 22 needs to have can be reduced, and the noise of the upper fan 22 can be decreased.

Figure 10:
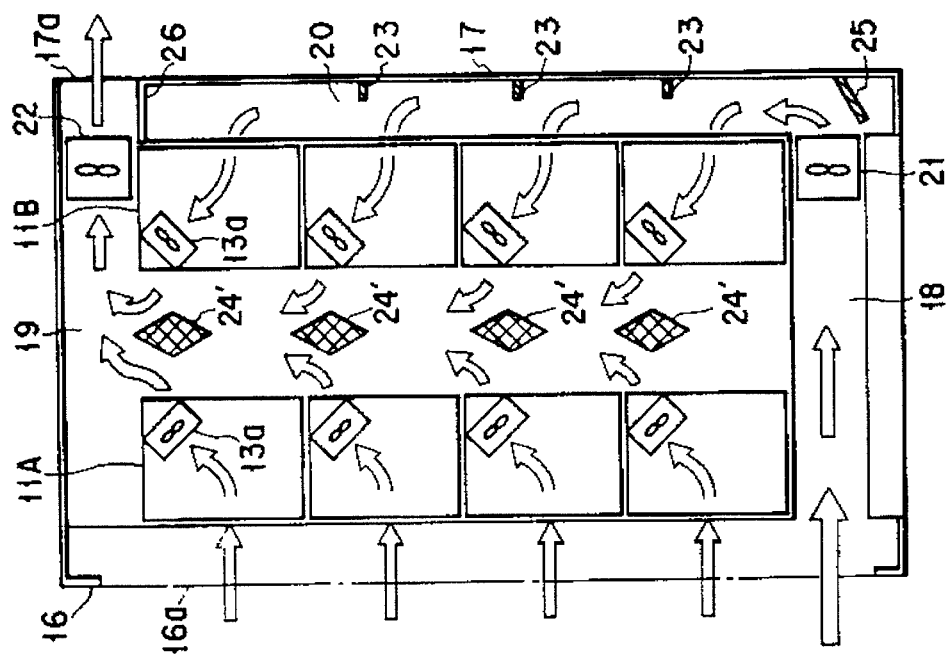
FIG. 10 is a cross-sectional side view showing schematically an electronic apparatus according to a sixth embodiment of an electronic apparatus cooling apparatus of the present invention.

An electronic apparatus according to a sixth embodiment of the invention will now be described with reference to FIG. 10. As is shown in FIG. 10, in the electronic apparatus according to the sixth embodiment, the front structure of the box body 10 of the electronic apparatus according to the fourth embodiment is modified. Specifically, the front face of the box body 10 is closed by a front cover 16, and a suction port 16a is formed in substantially the entire area of the front cover 16.

According to the sixth embodiment with the above structure, air streams introduced from the suction port 16a in the front cover 16 are directly fed into the modules 11 of the front-side device module 11A. Thus, the modules 11 can be effectively cooled. Of course, like the electronic apparatuses of the first, second and fourth embodiments, the modules can be cooled effective and the modules can be contained at high density. Moreover, the installation space can be effectively used and the degree of freedom of design can be enhanced. Besides, the air streams can be properly distributed within the box body 10. In particular, interference of the air streams exhausted from the device modules 11 can be prevented effectively.

Figure 11:
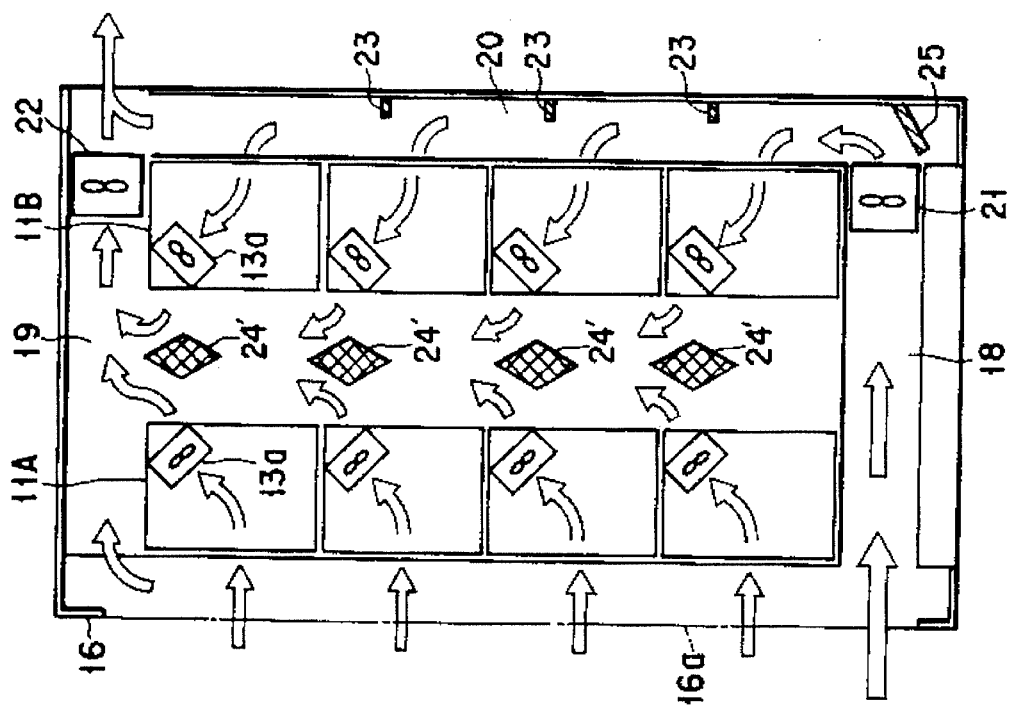
FIG. 11 is a cross-sectional side view showing schematically an electronic apparatus according to a seventh embodiment of an electronic apparatus cooling apparatus of the present invention.

An electronic apparatus according to a seventh embodiment of the invention will now be described with reference to FIG. 11. As is shown in FIG. 11, in the electronic apparatus according to the seventh embodiment, the sealing structure of the upper part of the box body 10 of the electronic apparatus according to the fifth embodiment is modified. In the electronic apparatus of the fifth embodiment, the upper part of the front-side device module 11A is sealed to prevent communication between the upper horizontal duct 19 and the suction port 16a of the front cover 16. In the seventh embodiment, however, sealing is not made between the upper horizontal duct 19 and suction port 16a of the front cover 16.

According to the seventh embodiment with the above structure, since sealing is not made between the upper horizontal duct 19 and suction port 16a of the front cover 16, part of the air coming from the suction port 16a in the front cover 16 enters the upper horizontal duct 19 and the air in the upper horizontal duct 19 is ventilated. Of course, like the electronic apparatuses of the first, second and fourth embodiments, the modules can be cooled effective and the modules can be contained at high density. Moreover, the installation space can be effectively used and the degree of freedom of design can be enhanced. Besides, the air streams can be properly distributed within the box body 10. In particular, interference of the air streams exhausted from the device modules 11 can be prevented effectively.

Figure 12:
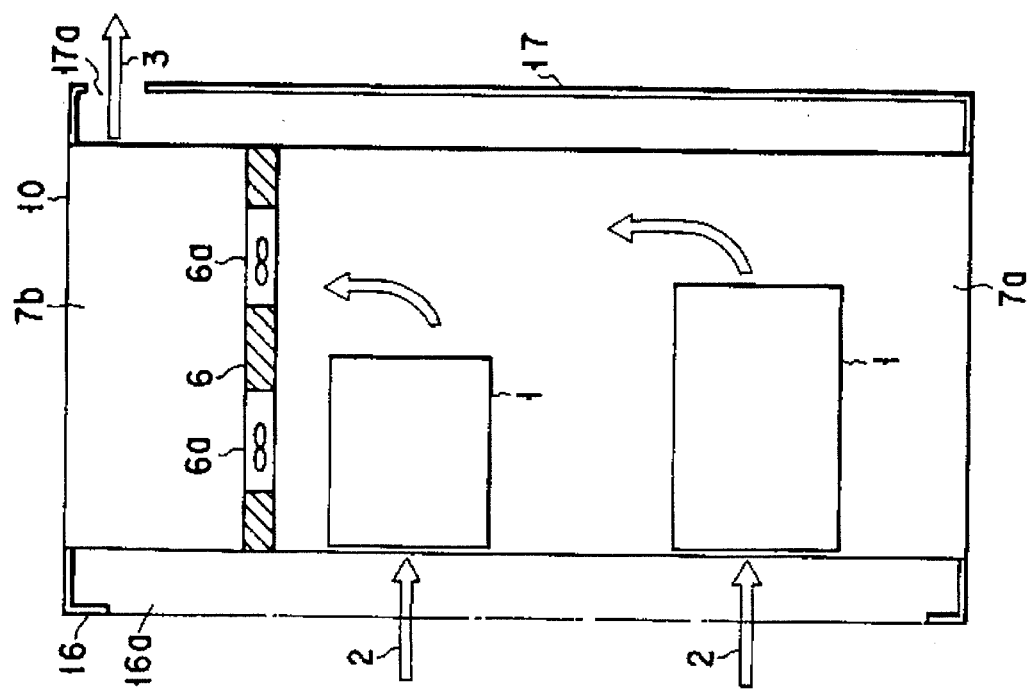
FIG. 12 is a cross-sectional side view showing schematically an electronic apparatus according to an eighth embodiment of an electronic apparatus cooling apparatus of the present invention.

An electronic apparatus according to an eighth embodiment of the cooling system of the invention will now be described with reference to FIG. 12. As is shown in FIG. 12, in the electronic apparatus according to the eighth embodiment, a sealing mechanism 6 is provided within the box body 10. The sealing mechanism 6 is provided to seal a lower part 7a, containing electronic elements 1, from an upper part 7b. The sealing mechanism 6 includes fan devices 6a for sucking air from the lower part 7a and discharging the air into the upper part 7b.

According to the eighth embodiment with the above structure, the sealing mechanism 6 including the fan devices 6a for sucking air from the lower part 7a and discharging the air into the upper part 7b is provided to seal the lower part 7a, containing electronic elements 1, from the upper part 7b. Thus, a negative pressure created by the fan devices 6a acts on the lower part 7a effectively. Thereby, air streams 2 flow from the lower part 7a to the upper part 7b smoothly and go out of the exhaust port 17 as an exhaust air stream 3. Therefore, the electronic elements 1 contained in the lower part 7a can be cooled effectively.

Electronic elements according to preferred embodiments of the electronic element cooling system of the present invention, in which device modules and circuit board modules to be cooled are contained, will now be described with reference to FIGS. 13 to 31.

In an electronic apparatus according to the ninth embodiment of the invention, as shown in FIG. 13, a plurality (two in FIG. 13) of device modules 31 (hereinafter referred to as "front-side device module 31A") are provided in stages within the box body 30 such that the modules 31 face the front side of the box body 30. A plurality (two in FIG. 13) of device modules 31 (hereinafter referred to as "rear-side device module 31B") are provided within the box body 30 so as to face the rear side of the box body 30. A confluent duct 32 is defined between the front-side and rear-side device modules 31A and 31B within the box body 30. Air streams 37 coming out of the front-side and rear-side device modules 31A and 31B are made confluent in the confluent duct 32.

Circuit board modules 33 are provided so as to seal the upper space of the front-side and rear-side device modules 31A and 31B. The circuit board module 33 is a combination of unit modules of many wiring boards including a mother board.

An upper horizontal duct 34 is provided at an upper part within the box body 10 and designed to exhaust the air streams 37 to the outside of the box body 30.

As is shown in FIG. 14, an air suction port 35a is formed in a lower half portion of a front cover 35 provided on the front face of the box body 30. An air suction port 36 is formed in a lower half portion of a rear cover 36 provided on the rear face of the box body 30, and an exhaust port 36b is formed in an upper portion of the rear cover 36.

Figure 15:
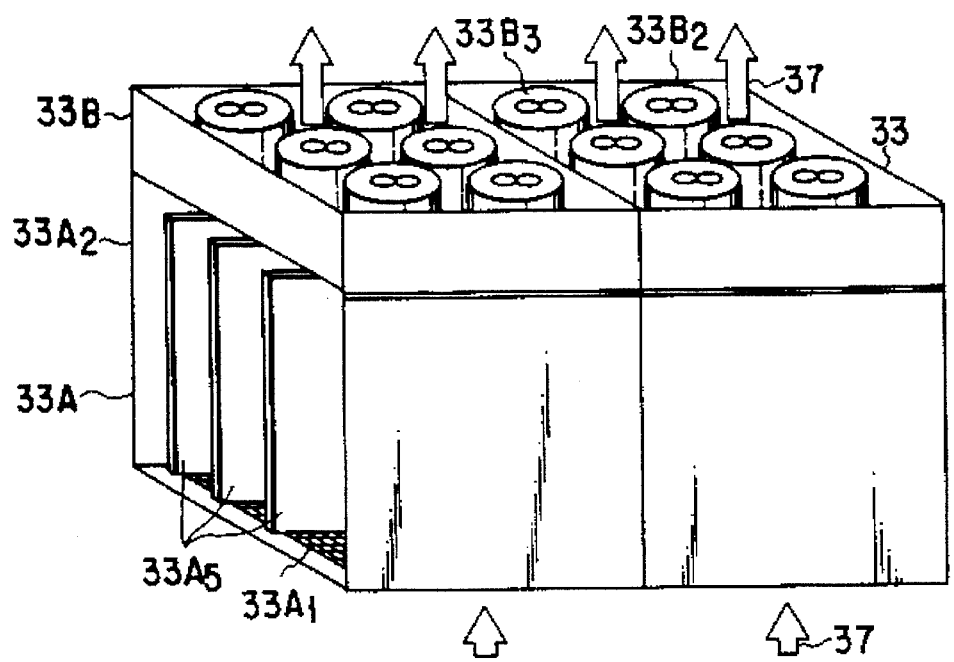
FIG. 15 is a perspective view showing schematically a circuit board module in the ninth embodiment.
Figure 16:
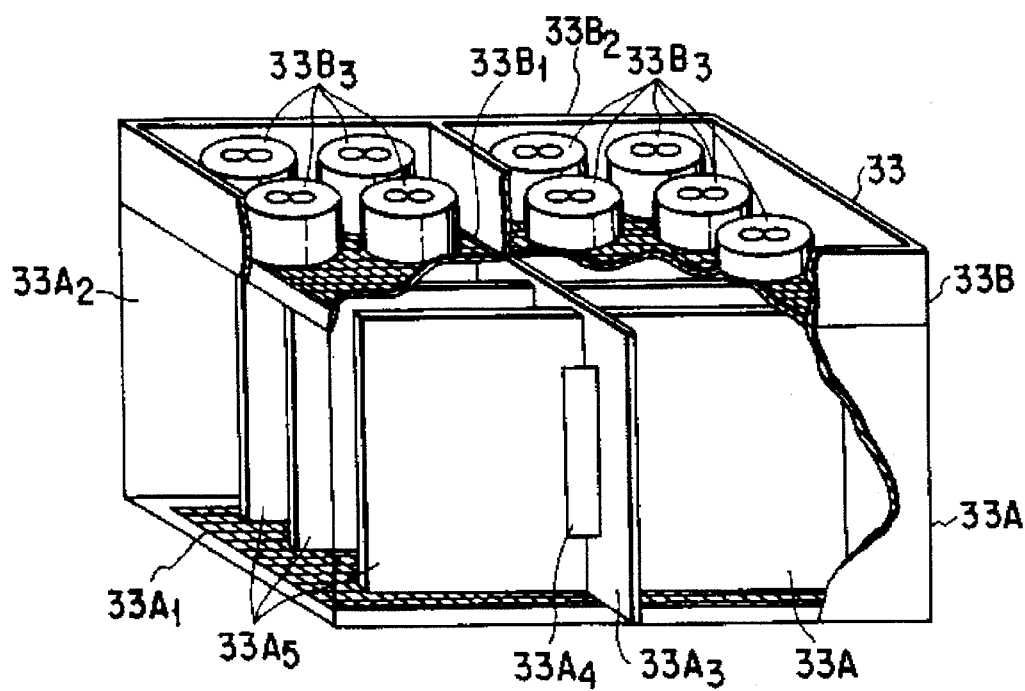
FIG. 16 is a partially cut-out perspective view showing schematically the circuit board module in the ninth embodiment.

The circuit board module 33 will now be described with reference to FIGS. 15 and 16.

The device module 31 may be considered to have the same structure as the device module 11 as shown in FIGS. 4 and 5. As is shown in FIGS. 15 and 16, the circuit board module 33 comprises a circuit board section 33A and a fan unit 33B.

The circuit board section 33A includes a frame $33A_2$ having a bottom face provided with a mesh suction port $33A_1$. Mother boards $33A_3$ are vertically arranged in the frame $33A_2$. Connectors $33A_4$ are provided at predetermined intervals on the mother boards $33A_3$. Wiring boards $33A_5$ are removably attached to the connectors $33A_4$. The fan unit 33B includes a frame $33B_2$ having a bottom face provided with a mesh suction port $33B_1$. A number of fans $33B_3$ are arranged on the frame $33B_2$. The fans $33B_3$ are situated in the mesh suction port $33B_1$ of the frame $33B_2$.

According to the circuit board module 33 with the above structure, air streams 37 introduced from the mesh suction port $33A_1$ in the circuit board section 33A flow upwards among the wiring boards $33A_5$ and go out. The air streams 37 coming out of the upper part of the frame $33A_2$ are sucked into the mesh suction port $33B_1$ by the fan unit 33B and exhausted.

The suction force produced by the fans $33B_3$ of the circuit board module 33 to suck the air streams 37 applies a negative pressure to the lower space of the circuit board module 33. Since the circuit board module 33 seals the upper space of the front-side and rear-side device modules 31A and 31B, the air streams 37 coming to the upper space are sucked into the circuit board module 33 without fail by virtue of the negative pressure and exhausted to the outside of the box body 30 from the exhaust port 36b via the upper horizontal duct 34.

In the electronic apparatus according to the present embodiment with the above structure, the air streams 37 introduced from the suction port 35a of the front cover 35 and the suction port 36a of the rear cover 36 pass through the device modules 31 of the front-side and rear-side device modules 31A and 31B. The air streams 37 coming out of the device modules 34 converge in the confluent duct 32. The confluent air stream 37 passes through the circuit board module 33 and goes out of the box body 30 from the exhaust port 36b via the upper horizontal duct 34. While passing through the device modules 31 and circuit board module 33, the air streams 37 cool the internal devices and wiring boards.

In the present embodiment, the air streams 37 can be effectively fed through the device modules 31 and circuit board module 33, without providing a fan at position corresponding to the exhaust port 36b of the rear cover 36 of the box body 30. The reason for this is that the lower space in the apparatus is sealed by the circuit board module 33 and the negative pressure created in the circuit module 33 acts in the lower space effectively.

In the prior art, in order to arrange modules at high density, the circuit board module 33 is situated above the device modules 31 arranged on the front and rear regions within the box body. However, the individual unit modules of the circuit board module 33 are juxtaposed with spaces provided. Thus, in order to effectively exhaust the air streams out of the box body 30 from the exhaust port 36b via the device modules 31 and circuit board module 33, it is necessary to provide a fan at a position corresponding to the exhaust port 36b of the rear cover 36.

In the present embodiment, since the circuit board module 33 seals the lower space, the negative pressure created in the circuit module 33 acts in the lower space effectively and the air streams can be sucked and exhausted to the outside of the box body 30, without providing a fan at position corresponding to the exhaust port 36b of the rear cover 36 of the box body 30.

In this embodiment, attachment of a fan is not needed, while the cooling characteristics are maintained. Thus, the structure of the apparatus is simplified and the noise is reduced in operation. Specifically, since the fan which causes operation noise and exhaust noise is not provided on the cover of the electronic apparatus or thereabouts, the noise can be reduced. In this embodiment, such an fan is replaced by the fans $33B_3$ of the circuit board module 33. Although the fans $33B_3$ cause operation noise and exhaust noise, the amount of noise is negligible. The reason for this is that the direction of air streams blown from the fans $33B_3$ intersects the exhaust port 36b at right angles, so that noise of the fans $33B_3$ does not easily leak to the outside.

Figure 17:
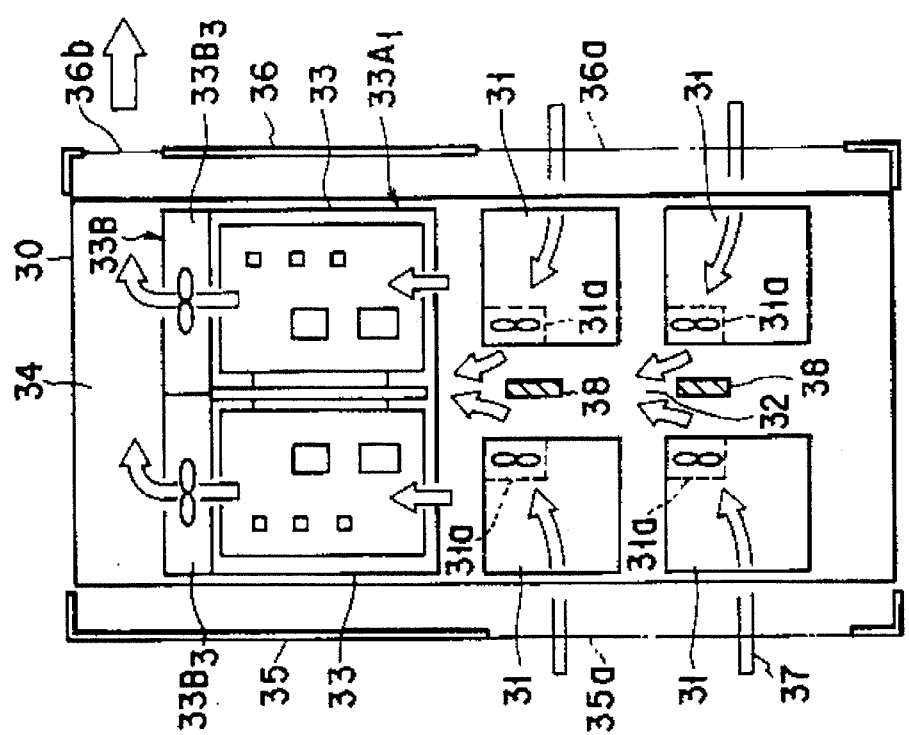
FIG. 17 is a cross-sectional side view showing schematically an electronic apparatus according to a tenth embodiment of an electronic apparatus cooling apparatus of the present invention.

An electronic apparatus according to a tenth embodiment of the invention will now be described with reference to FIG. 17. As is shown in FIG. 17, in the electronic apparatus of the tenth embodiment, partition plates 38 are provided in the confluent duct 32 of the electronic apparatus of the ninth embodiment. The partition plates 38 guide air streams coming out of the device modules 31 of the front-side and rear-side device modules 31A and 31B along a predetermined passage, thereby preventing interference of the air steams.

According to the electronic apparatus of the tenth embodiment, the interference of the air streams coming out of the modules 31 can be prevented and the air streams can be guided smoothly, in addition to the advantage of the ninth embodiment. Therefore, effective cooling can be performed.

Figure 18:
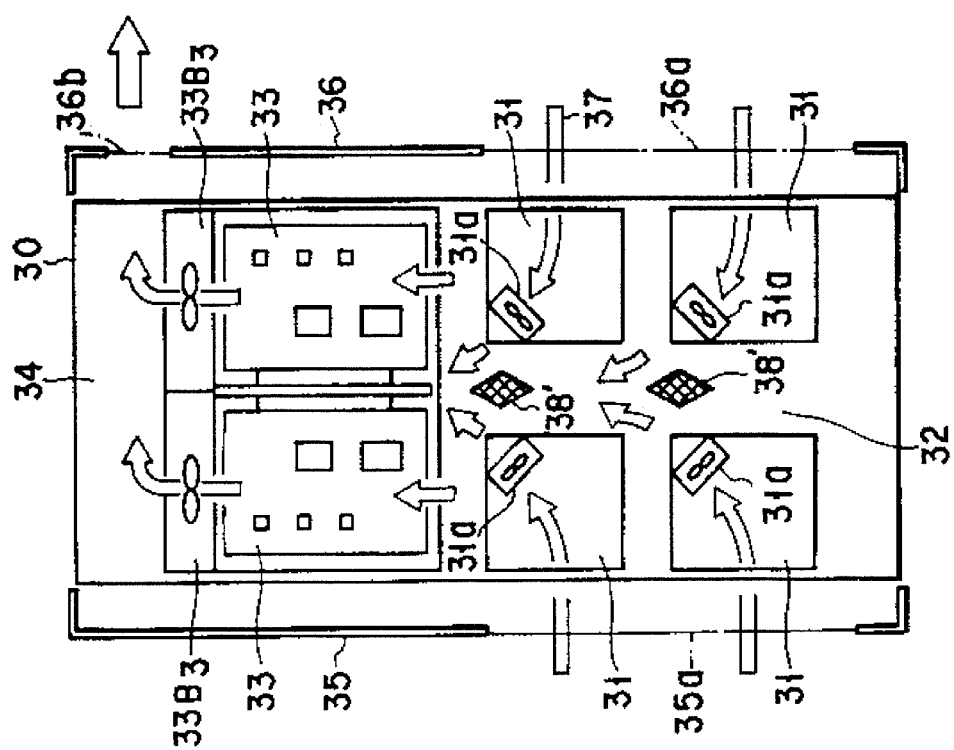
FIG. 18 is a cross-sectional side view showing schematically an electronic apparatus according to an eleventh embodiment of an electronic apparatus cooling apparatus of the present invention.

An electronic apparatus according to an eleventh embodiment of the invention will now be described with reference to FIG. 18. As is shown in FIG. 18, in the electronic apparatus of the eleventh embodiment, the fans 31a of the device modules 31 and partition plates 38 in the apparatuses of the ninth and tenth embodiments are modified to let the air streams 37 to flow in desirable courses. The desirable courses of the air streams 37 may vary, depending on the tiered arrangement of the device modules 31. In FIG. 18, the desirable courses are those in which the air steams 37 coming out of the modules 31 go upwards in the confluent duct 32. Accordingly, the fans 31a are inclined to suck and discharge the air streams 37 upwards in the confluent duct 32, and each of partition plates 38' of the fourth embodiment has a rhombic cross section.

According to the eleventh embodiment with the above structure, the air streams can be properly distributed within the box body 30. In particular, interference of the air streams exhausted from the device modules 31 can be prevented effectively. Of course, like the electronic apparatuses of the ninth and tenth embodiments, the noise is reduced, effective cooling is achieved, and modules can be mounted at high density.

Figure 19:
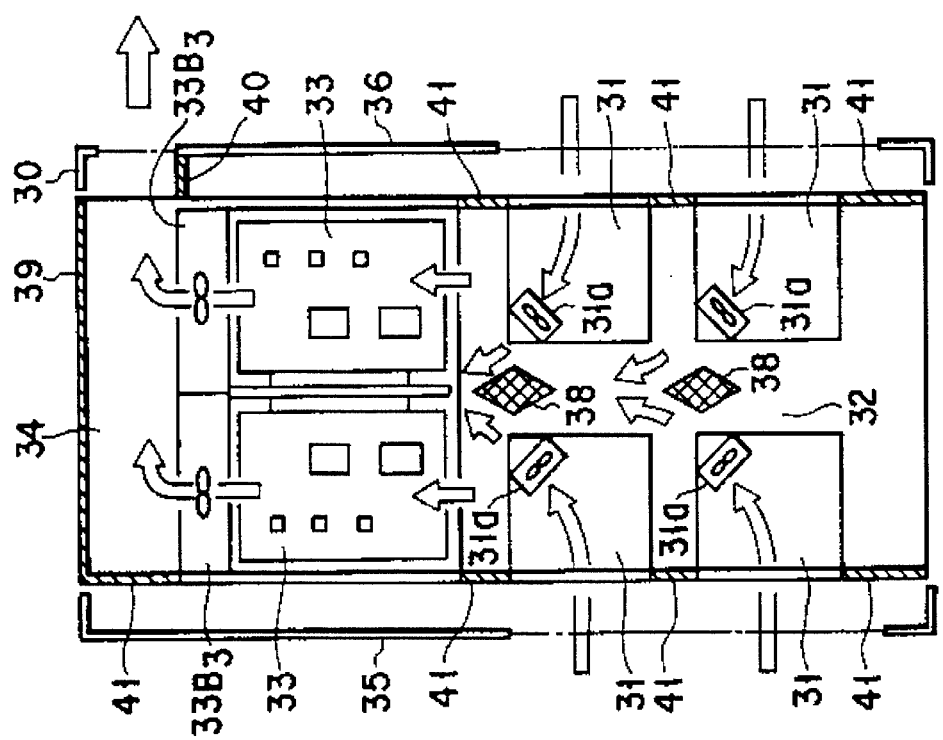
FIG. 19 is a cross-sectional side view showing schematically an electronic apparatus according to a twelfth embodiment of an electronic apparatus cooling apparatus of the present invention.

An electronic apparatus according to a twelfth embodiment of the invention will now be described with reference to FIG. 19. As is shown in FIG. 19, in the electronic apparatus of the twelfth embodiment, the sealing structure of the upper part of the box body 30 in the electronic apparatus according to each of the ninth to eleventh embodiments is modified, and the connecting portion between the exhaust port 36b and the rear space of the rear cover 36 is modified. Specifically, a mesh cover 39 is provided on the top face of the box body 30, and a sealing plate 40 is provided between the exhaust port 36b and the rear space of the rear cover 36 to prevent communication therebetween. In addition, sealing members 41 are provided within the box body 30 at portions where neither the device module 31 nor circuit board module 33 is situated.

According to the twelfth embodiment with the above structure, the air streams blown out of the fans $33B_3$ of the circuit board module 33 can be exhausted directly to the outside of the box body 30 via the mesh cover 39 provided on the top face of the box body 30. Moreover, the sealing members 41 can prevent leak of air via the portions where neither the device module 31 nor circuit board module 33 is situated. Therefore, effective cooling can be achieved.

Figure 20:
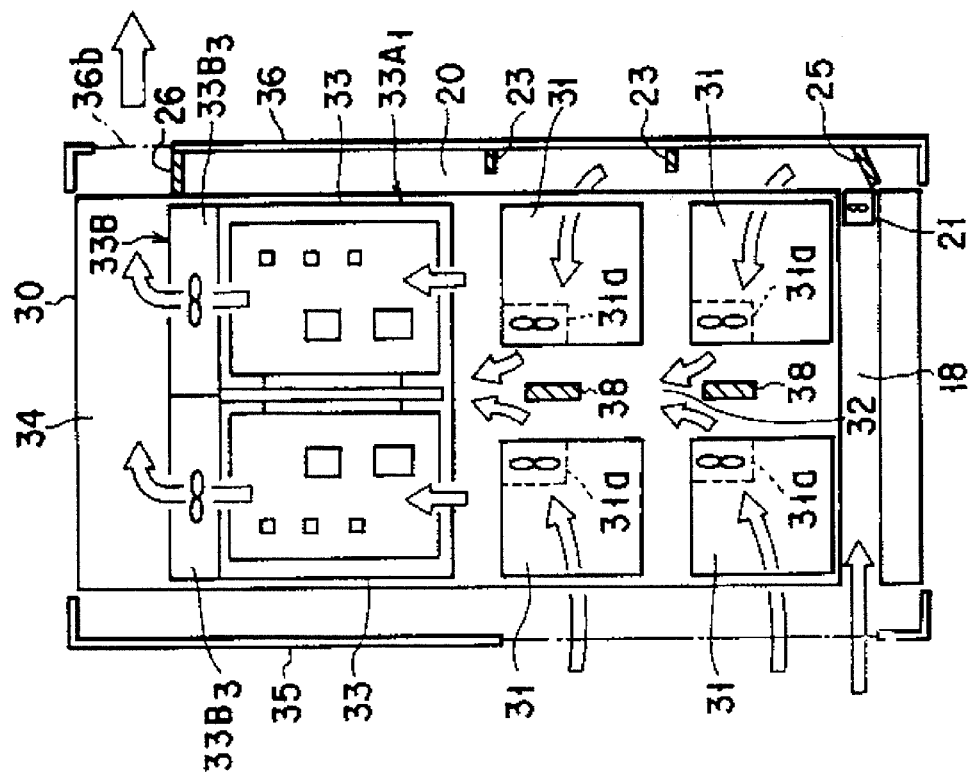
FIG. 20 is a cross-sectional side view showing schematically an electronic apparatus according to a 13th embodiment of an electronic apparatus cooling apparatus of the present invention.

An electronic apparatus according to a 13th embodiment of the invention will now be described with reference to FIG. 20. As is shown in FIG. 20, in the electronic apparatus of the 13th embodiment, a lower horizontal duct 18 for introducing an air stream from the outside is provided at a lower part within the box body 30 of the electronic apparatus according to each of the ninth to twelfth embodiments. A rear-side vertical duct 20 for introducing the air stream from the lower horizontal duct 18 to the rear side of the electronic element 31 is provided between the box body 30 and the rear cover 36. The lower horizontal duct 18 is provided with a lower fan 21 for guiding the air stream, introduced into the lower horizontal duct 18, into the rear-side vertical duct 20. In addition, a guide unit comprising orientation plates 23, a guide plate 25 and a sealing plate 26 is provided to guide the air stream introduced into the electronic elements 31 along predetermined passages.

According to the 13th embodiment, the same advantages as obtained in the ninth to twelfth embodiments as well as the second embodiment can be brought about.

An electronic apparatus according to a 14th embodiment of the present invention will now be described with reference to FIG. 21. As is shown in FIG. 21, in the electronic apparatus of the 14th embodiment, a lower horizontal duct 18 for introducing an air stream from the outside is provided at a lower part within the box body 30 of the electronic apparatus according to each of the ninth to 13th embodiments. A rear-side vertical duct 20 for introducing the air stream from the lower horizontal duct 18 to the rear side of the electronic element 31 is provided between the box body 30 and the rear cover 36. A front-side vertical duct 28 is provided between the box body 30 and front cover 35, thereby introducing an air stream introduced into the lower horizontal duct 18 into the front parts of the electric elements 31. The lower horizontal duct 18 is provided with a lower fan 21 for guiding the air stream, introduced into the lower horizontal duct 18, into the rear-side vertical duct 20. In addition, a guide unit comprising orientation plates 23, a guide plate 25 and sealing plates 26 is provided to guide the air stream introduced into the electronic elements 31 along predetermined passages.

According to the 14th embodiment, the same advantages as obtained in the ninth to twelfth embodiments as well as the third embodiment can be brought about.

Figure 23:
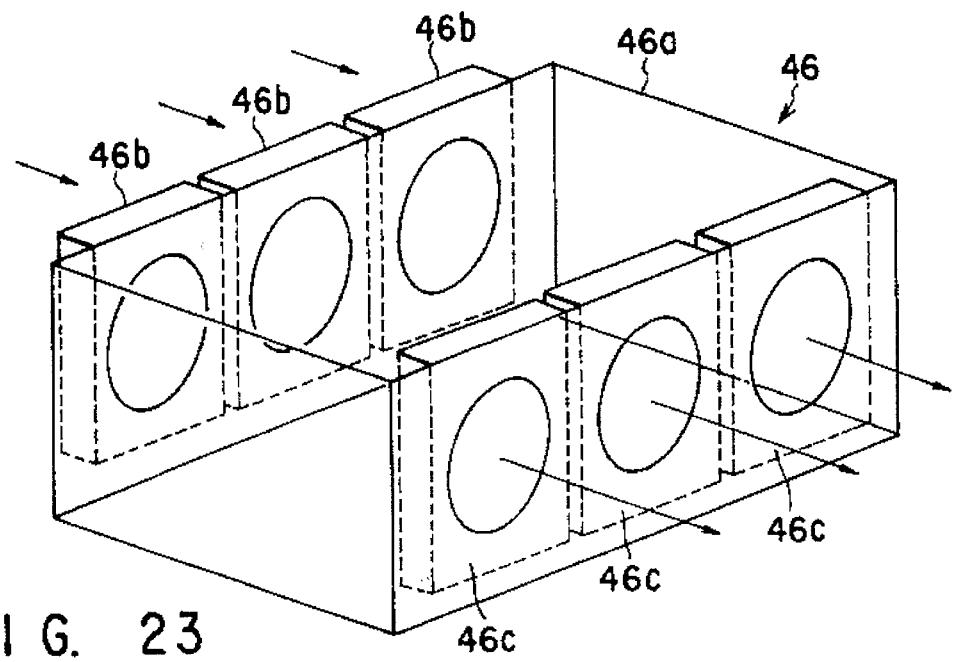
FIG. 23 is a perspective view showing schematically the fan apparatus according to the 14th embodiment of the invention.
Figure 24:
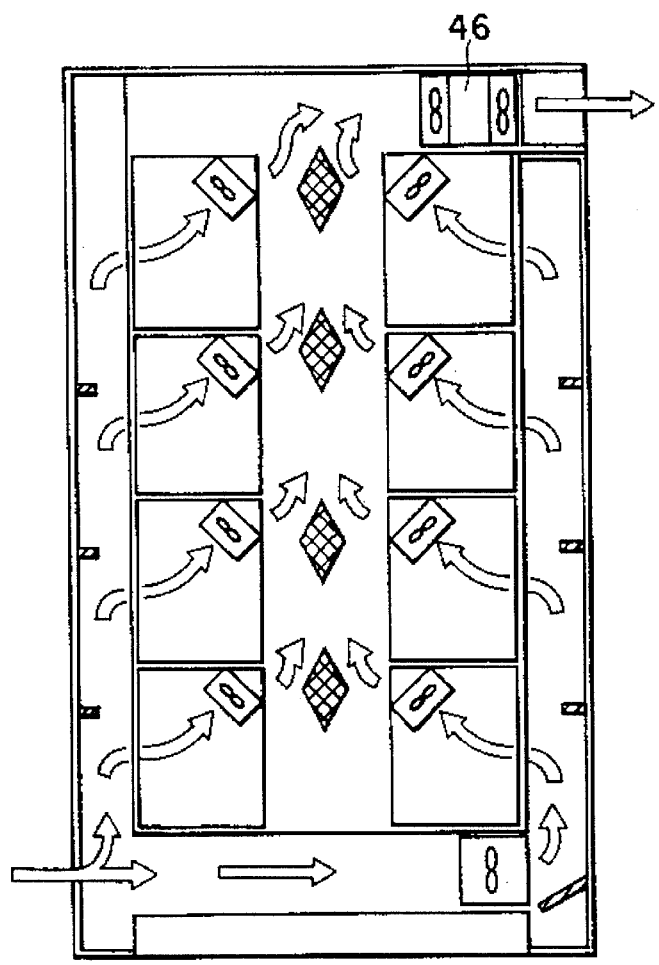
FIG. 24 is a cross-sectional side view showing schematically another example of an electronic apparatus in which a fan apparatus according to the present invention is built.

Electronic apparatuses according to 15th and 16th embodiments of the invention will now be described with reference to FIGS. 22 to 24. At first, the electronic apparatus according to the 15th embodiment of the invention will now be described with reference to FIGS. 22 and 23. Specifically, in the electronic apparatus according to the 15th embodiment, elements to be cooled, such as device modules and circuit board modules, are situated within a box body 42. A suction port (not shown) is formed in the front cover 44 situated on the front face of the box body 42. An exhaust port 45*b* is formed in an upper part of the rear cover 45 situated on the rear face of the box body 42. A cooling mechanism 46 is provided at a position facing the exhaust port 45*b* of the box body 42. The cooling mechanism comprises fan units 46*b* and 46*c* each comprising three fans, as shown in FIG. 23, on one opening side and the opening side of a casing 46*a* constituting a cylindrical body.

The apparatus of this embodiment operates as follows. Specifically, the cooling performance of the cooling mechanism 46 situated near the exhaust port is high, since the cooling mechanism 46 employs the fans 46*b* and 46*c*. In addition, the fan units 46*b* and 46*c* are provided, respectively, on both opening sides of the casing 46*a* constituting the cylindrical body. If the fan units are situated apart from each another at a predetermined distance (preferably, greater than the diameter of each fan), interference of noise of the fan units does not easily occur and howling of fan units due to a slight different in rotational speed (i.e. a difference in noise frequency) can be prevented.

An electronic apparatus according to a 16th embodiment of the invention will now be described with reference to FIG. 24. In the electronic apparatus according to the 16th embodiment, the upper fan 22 in the electronic apparatus according to the fifth embodiment as shown in FIG. 9 is replaced with a cooling mechanism 46 as shown in FIGS. 22 and 23.

The apparatus according to the 16th embodiment operates as follows. Specifically, like the eleventh embodiment, the cooling performance of the cooling mechanism 46 situated near the exhaust port is high, since the cooling mechanism 46 employs the fan units 46*b* and 46*c*. In addition, the fan units 46*b* and 46*c* are provided, respectively, on both opening sides of the casing 46*a* constituting the cylindrical body. If the fan units are situated apart from each other at a predetermined distance (preferably, greater than the diameter of each fan), interference of noise of the fan units does not easily occur and howling of fan units can be prevented.

As with the fifth embodiment, the air streams can be properly distributed within the box body 30. In particular, interference of the air streams exhausted from the device modules 31 can be prevented effectively. Of course, like the electronic apparatuses of the ninth and tenth embodiments, the noise is reduced, effective cooling is achieved, and modules can be mounted at high density.

In each of the above embodiments, the front face and rear face of the box body are provided with the covers. Needless to say, each embodiment is applicable to electronic apparatuses having covers on both side faces. The device modules and circuit board modules are typical examples of elements to be cooled, and each embodiment is applicable to the use of other heat radiating elements.

As has been described above in detail, in the method and system for cooling the electronic apparatus according to the present invention, an air stream introduced from one side of the apparatus is fed towards the other side thereof and then guided upwards, so that the air stream is fed into the electronic elements from the other side of the apparatus. Thus, those parts of the electronic devices, which face the other side of the apparatus, can be effectively cooled.

In the method and system for cooling the electronic apparatus according to the present invention, an air stream introduced from one side of the apparatus is fed towards the other side thereof and then guided upwards in both-side regions within the apparatus, so that the air stream is fed into the electronic elements from both sides of the apparatus. Thus, those parts of the electronic devices, which face both sides of the apparatus, can be effectively cooled.

In the cooling system for cooling the electronic apparatus according to the present invention, a lower part of the apparatus, which contains electronic elements, is sealed from an upper part of the apparatus by means of a sealing mechanism including a fan apparatus for sucking air from the lower part and exhausting the air to the upper part. The negative pressure created by the fan apparatus acts on the lower part effectively. Thereby, the air stream is let to flow smoothly from the lower part to the upper part, and the electronic elements situated in the lower part can be cooled effectively.

In the fan apparatus of the present invention, the distance provided between the first and second fans is greater than the diameter of each fan. Thus, the cooling performance can be increased by the two fans. Moreover, interference of noise of the fans does not occur easily and howling of fans can be prevented.

According to the present invention, there can be provided a method, a system and a fan apparatus for cooling an electronic apparatus with high efficiency.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cooling system applied to an electronic apparatus including a box body with a front side, a rear side, a bottom side and a top side, a first electronic device unit housed within the box body on said front side, a second electronic device unit housed within the box body on said rear side, a front cover situated on said front side of the box body, and a rear cover situated on the rear side of the box body, said cooling system cooling said first and second electronic device units, said cooling system comprising:

a suction port, formed in said front cover, for introducing an air stream from the outside of said box body and guiding the air stream to at least said first electronic device unit;

a horizontal duct for introducing an air stream from said suction port and guiding the air stream towards said rear side of the box body, said horizontal duct being provided on said bottom side of the box body, having one end portion communicating with said suction port, and having the other end portion extending to said rear side of the box body;

a vertical duct for introducing the air stream from said horizontal duct and guiding the air stream to said second electronic device unit, said vertical duct being provided on said rear side of the box body, having one end portion communicating with said horizontal duct, and having the other end portion extending to said top side of the box body;

a partition member, provided between said first electronic device unit and said second electronic device unit, for separating the air stream coming out from said first electronic device unit and the air stream coming out from said second electronic device unit; and an exhaust port, formed in said rear cover, for taking in the air streams from said first and second electronic device units and exhausting the air streams to the outside of the box body.

2. The cooling system according to claim 1, further comprising an orientation member provided at at least one of said suction port, said horizontal duct, said vertical duct and said exhaust port, for orientating said air stream to at least one of said first and second electronic device units.

3. The cooling system according to claim 1, wherein at least one of said first and second electronic device units comprises a plurality of electronic elements.

4. The cooling system according to claim 3, wherein said plurality of electronic elements are arranged in stages within said box body.

5. The cooling system according to claim 1, further comprising a fan device provided in at least one of said suction port, said horizontal duct, said vertical duct and said exhaust port.

6. The cooling system according to claim 5, wherein said fan device comprises a first fan and a second fan, said second fan situated at a predetermined distance from said first fan.

7. The cooling system according to claim 5, wherein said fan device comprises a casing with first and second openings, a first fan provided in said first opening of the casing and a second fan provided in said second opening of the casing, wherein said first fan and said second fan are separated from each other at a distance equal to or greater than the diameter of said fans.

8. A cooling system applied to an electronic apparatus including a box body with a front side, a rear side, a bottom side and a top side, a first electronic device unit housed within the box body on said front side, a second electronic device unit housed within the box body on said rear side, a front cover situated on said front side of the box body, and a rear cover situated on the rear side of the box body, said cooling system cooling said first and second electronic device units, said cooling system comprising: a suction port, formed in said front cover, for introducing an air stream from the outside of said box body;

a front-side vertical duct for introducing the air stream from said suction port and guiding the air stream to said first electronic device unit, said front-side vertical duct being provided on said front side of the box body, having one end portion communicating with said suction port, and having the other end portion extending to said top side of the box body;

a horizontal duct for introducing an air stream from said suction port and guiding the air stream towards said rear side of the box body, said horizontal duct being provided on said bottom side of the box body, having one end portion communicating with said suction port, and having the other end portion extending to said rear side of the box body;

a rear-side vertical duct for introducing the air stream from said horizontal duct and guiding the air stream to said second electronic device unit, said rear-side vertical duct being provided on said rear side of the box body, having one end portion communicating with said horizontal duct, and having the other end portion extending to said top side of the box body;

a partition member, provided between said first electronic device unit and said second electronic device unit, for separating the air stream coming out from said first electronic device unit and the air stream coming out from said second electronic device unit; and an exhaust port, formed in said rear cover, for taking in the air streams from said first and second electronic device units and exhausting the air streams to the outside of the box body.

9. The cooling system according to claim 8, further comprising an orientation member provided at at least one of said suction port, said horizontal duct, said front-side vertical duct, said rear-side vertical duct and said exhaust port, for orientating said air stream to at least one of said first and second electronic device units.

10. The cooling system according to claim 8, wherein at least one of said first and second electronic device units comprises a plurality of electronic elements.

11. The cooling system according to claim 10, wherein said plurality of electronic elements are arranged in stages within said box body.

12. The cooling system according to claim 8, further comprising a fan device provided in at least one of said suction port, said horizontal duct, said front-side vertical duct, said rear-side vertical duct and said exhaust port.

13. The cooling system according to claim 12, wherein said fan device comprises a first fan and a second fan, said second fan situated at a predetermined distance from said first fan.

14. The cooling system according to claim 12, wherein said fan device comprises a casing with first and second openings, a first fan provided in said first opening of the casing and a second fan provided in said second opening of the casing, wherein said first fan and said second fan are separated from each other at a distance equal to or greater than the diameter of said fans.

15. A cooling system applied to an electronic apparatus including a box body with a front side, a rear side, a bottom side, a top side, a lower part and an upper part, an electronic device unit housed within at least said lower part of the box body of said lower and upper parts of the box body, a front cover situated on said front side of the box body, and a rear cover situated on the rear side of the box body, said cooling system cooling said electronic device units, said cooling system comprising:

a front-side suction port, formed in said front cover, for introducing an air stream from the outside of said box body and guiding the air stream to at least said electronic device unit;

an exhaust port, formed in said rear cover, for taking in the air stream from said box body and exhausting the air stream to the outside of the box body; and a sealing mechanism in said box body sealing and separating said lower part from said upper part, and including a fan device for sucking the air stream from said lower part of the box body and exhausting the air stream to the upper part of the box body.

16. The cooling system according to claim 15, wherein said sealing mechanism includes a circuit board module comprising a circuit board section having a plurality of wiring boards and a fan unit provided adjacent to the circuit board section.

17. The cooling system according to claim 16, wherein said circuit board module comprises:

a frame with mesh-like air suction port, a mother board provided at right angles with said frame, a plurality of connectors provided on said mother board, and a plurality of wiring boards detachably attached to said connectors; and a plurality of fans provided on said frame.

18. The cooling system according to claim 15, further comprising a rear-side suction port, formed in said rear cover, for introducing an air stream from the outside of the box body and guiding the air stream to at least said electronic device unit.

19. The cooling system according to claim 18, wherein said electronic device unit comprises:

a first electronic element housed in said lower part on the front side of the box body;

a second electronic element housed in said lower part on the rear side of the box body; and a partition member, provided between said first electronic element and said second electronic element, for separating the air stream coming out from said first electronic element and the air stream coming out from said second electronic element.

20. The cooling system according to claim 15, further comprising:

a horizontal duct for introducing an air stream from said suction port and guiding the air stream towards said rear side of the box body, said horizontal duct being provided in said lower part of the box body, having one end portion communicating with said suction port, and having the other end portion extending to said rear side of the box body; and a vertical duct for introducing the air stream from said horizontal duct and guiding the air stream to said electronic device unit, said vertical duct being provided on said rear side of the box body, having one end portion communicating with said horizontal duct, and having the other end portion extending to said top side of the box body.

21. The cooling system according to claim 15, wherein said electronic device unit comprises:

a first electronic element housed in said lower part on the front side of the box body;

a second electronic element housed in said lower part an the rear side of the box body; and a partition member, provided between said first electronic element and said second electronic element, for separating the air stream coming out from said first electronic element and the air stream coming out from said second electronic element.

22. The cooling system according to claim 21, further comprising an orientation member provided at at least one of said suction port, said horizontal duct, said vertical duct and said exhaust port, for orientating said air stream to said first and second electronic device units.

23. The cooling system according to claim 15, further comprising:

a horizontal duct for introducing an air stream from said suction port and guiding the air stream towards said rear side of the box body, said horizontal duct being provided in said lower part of the box body, having one end portion communicating with said suction port, and having the other and portion extending to said rear side of the box body;

a front-side vertical duct for introducing the air stream from said suction port and guiding the air stream to said electronic device unit, said front-side vertical duct being provided on said front side of the box body, having one end portion communicating with said suction port, and having the other end portion extending to said top side of the box body; and a rear-side vertical duct for introducing the air stream from said horizontal duct and guiding the air stream to said electronic device unit, said rear-side vertical duct being provided on said rear side of the box body, having one end portion communicating with said horizontal duct, and having the other end portion extending to said top side of the box body.

24. The cooling system according to claim 23, wherein said electronic device unit comprises:

a first electronic element housed in said lower part on the front side of the box body;

a second electronic element housed in said lower part on the rear side of the box body; and a partition member, provided between said first electronic element and said second electronic element, for separating the air stream coming out from said first electronic element and the air stream coming out from said second electronic element.

25. The cooling system according to claim 24, further comprising an orientation member provided at at least one of said suction port, said horizontal duct, said front-side vertical duct, said rear-side vertical duct and said exhaust port, for orientating said air stream to said first and second electronic device units.

* * * * *